(12) United States Patent
Hsiao et al.

(10) Patent No.: US 7,492,072 B2
(45) Date of Patent: Feb. 17, 2009

(54) DRIVING UNIT FOR ANALOG METER

(75) Inventors: Cheng-Fang Hsiao, Sijhih (TW); Chia-Ching Chang, Hsinchu (TW); I-Sung Tsai, Jhunan Township, Miaoli County (TW)

(73) Assignee: Foxconn Technology Co., Ltd, Tu-Cheng, Taipei Hsien ( * ) Notice: Subject to any disclaimer, the term of this patent is extended or adjusted under 35 U.S.C. 154(b) by 326 days.

(21) Appl. No.: 11/455,257

(22) Filed: Jun. 19, 2006

(65) Prior Publication Data

US 2007/0290580 A1   Dec. 20, 2007

(51) Int. Cl.
*H02K 7/10* (2006.01)
(52) U.S. Cl. .......................................... 310/98
(58) Field of Classification Search ................... 310/98, 310/153, 156
See application file for complete search history.

(56) References Cited

U.S. PATENT DOCUMENTS

| 5,884,390 | A * | 3/1999 | Gunsallus et al. | 29/598 |
| 6,331,746 | B1 * | 12/2001 | Fujitani et al. | 310/263 |
| 2001/0042401 | A1 * | 11/2001 | Norres et al. | 73/146 |

* cited by examiner

*Primary Examiner*—Jean F Duverne
(74) *Attorney, Agent, or Firm*—Wei Te Chung

(57) ABSTRACT

The present invention provides a driving unit for an analog meter. The size of the driving unit is modified into a column shape, so that the first tape and second tape of the stator unit can be placed in double layers, guiding more pins of the input terminal from the same side. The driving unit can simplify the manufacturing process, and the size of the components of the driving unit are greatly reduced, making assembly more flexible or emptying more space for other components. The more concentrated pin can be connected easily or can be provided with more options for connection.

6 Claims, 5 Drawing Sheets

DRIVING UNIT FOR ANALOG METER

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates generally to a driving unit for an analog meter, and more particularly to an invention that can be modified under circumstances where space is limited, such that the size of the driving unit can be greatly reduced, making the assembly more changeable and the pin more able to be connected.

BACKGROUND OF THE INVENTION

As shown in FIGS. 1, 2, there are an exploded view and perspective view of the conventional driving unit for an analog meter. The casing 1 is formed corresponding to the internal structure, and the coil set 2 of its internal structure radiates around the turner 3. Because the length of its coil set 2 is longer, it takes more room, which increases the total space of the conventional driving unit for analog meter. Even though its thickness can be placed inside the driving unit for the analog meter, the flexibility is reduced due to the space. The space around the edge is being used; therefore, it is not available for other components. Because its shape is fixed, there is no flexibility for installation, and it can not meet the demand of the industry.

Moreover, since the distance between the coil set 2 is far, and since distance is extended because of its limitation on space, the pin 5 5a5b 5c from the casing 1 of the coil set 2 becomes distant (as shown in FIG. 2, which is the view of the pins extended from the bottom of the casing), which makes the connection inconvenient and difficult. Because of the distance between the pins 5 5a5b 5c, it causes the problems, such as assembly of the driving unit for the analog meter losing its flexibility, as well as taking too much room.

Thus, to overcome the aforementioned problems of the prior art, it would be an advancement in the art to provide an improved structure that can significantly improve efficacy.

To this end, the inventor has provided the present invention of practicability after deliberate design and evaluation based on years of experience in the production, development and design of related products.

The features and the advantages of the present invention will be more readily understood upon a thoughtful deliberation of the following detailed description of a preferred embodiment of the present invention with reference to the accompanying drawings.

BRIEF SUMMARY OF THE INVENTION

The driving unit comprises a stator unit, which has a longitudinal hollow column shape. The stator unit includes a longitudinal hollow column, a claw, a coil set and an input terminal. The gears of the claw are lined up around the center hole of the column, and it can be separated by insulating tape. By so doing, it can effectively improve the disadvantage of the conventional coil set of the driving unit for the analog meter radiating around the side of the rotator. The coil set includes a first tape and a second tape, so that the input terminal is placed between the first tape and the second tape.

DETAILED DESCRIPTION OF THE INVENTION

The present invention provides a stator unit and an input terminal thereof, the stator unit being placed around the rotor unit and integrating the input terminal to one location. The structure and technology of the present invention is explained as follows.

Figure 1:
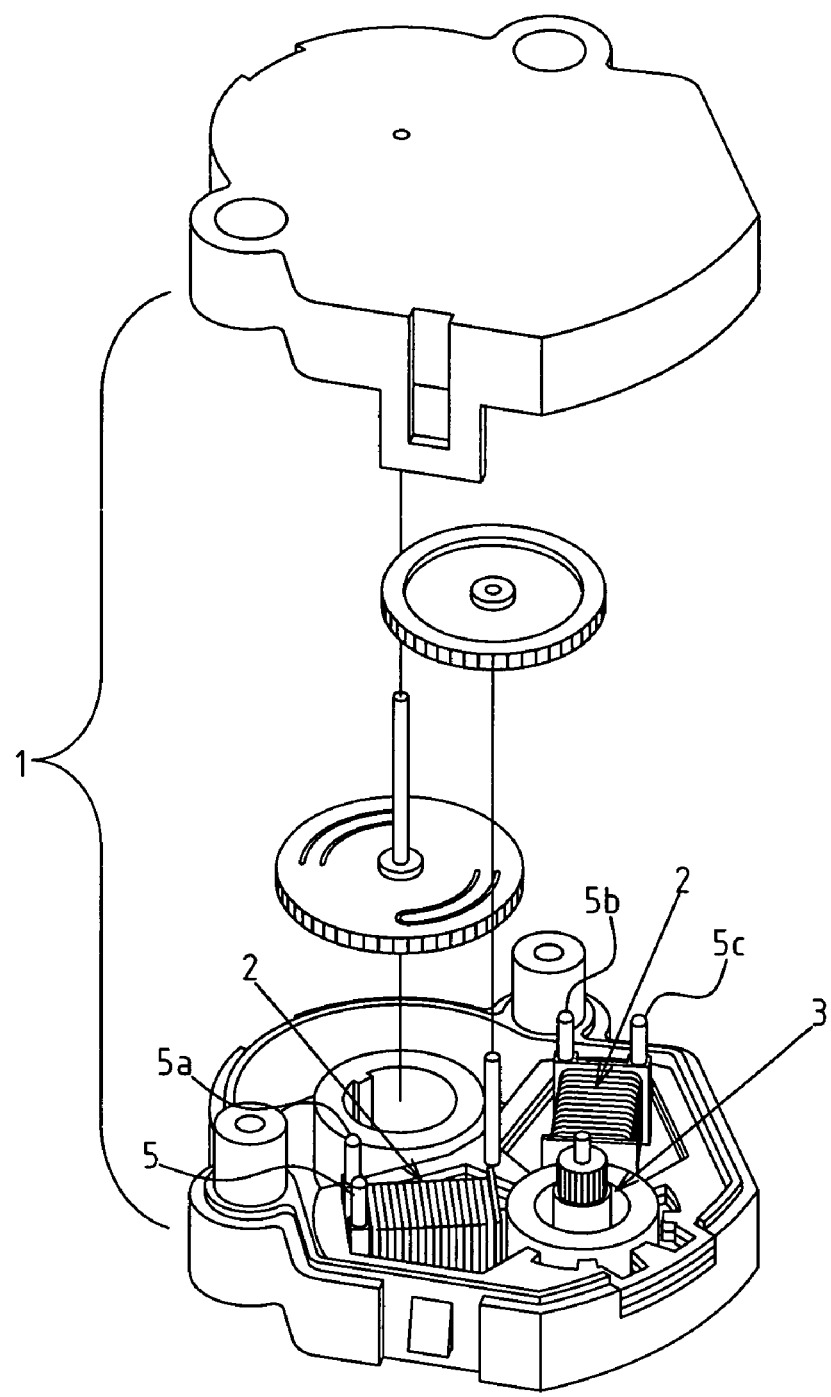
FIG. 1 shows an exploded perspective view of the conventional structure.
Figure 2:
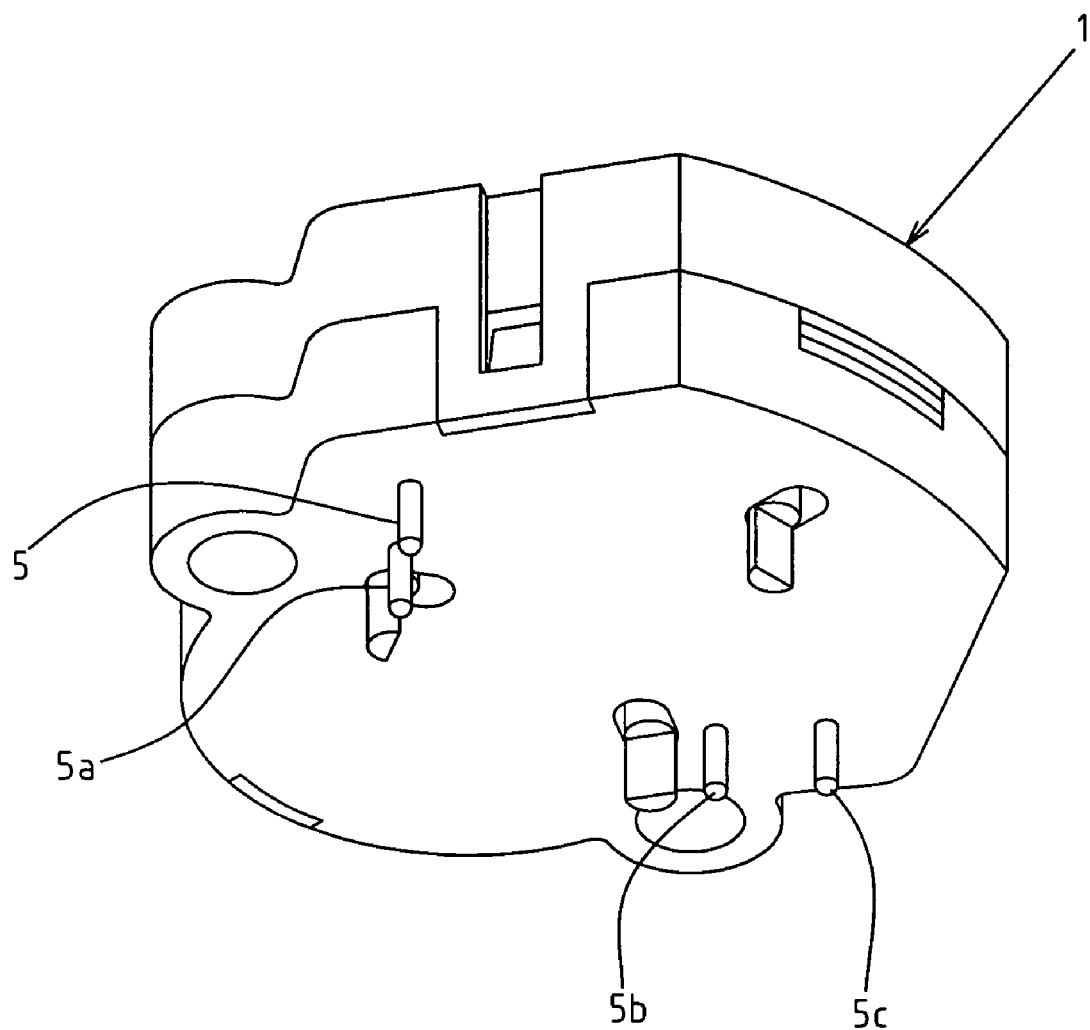
FIG. 2 shows a bottom perspective view of the conventional structure.
Figure 3:
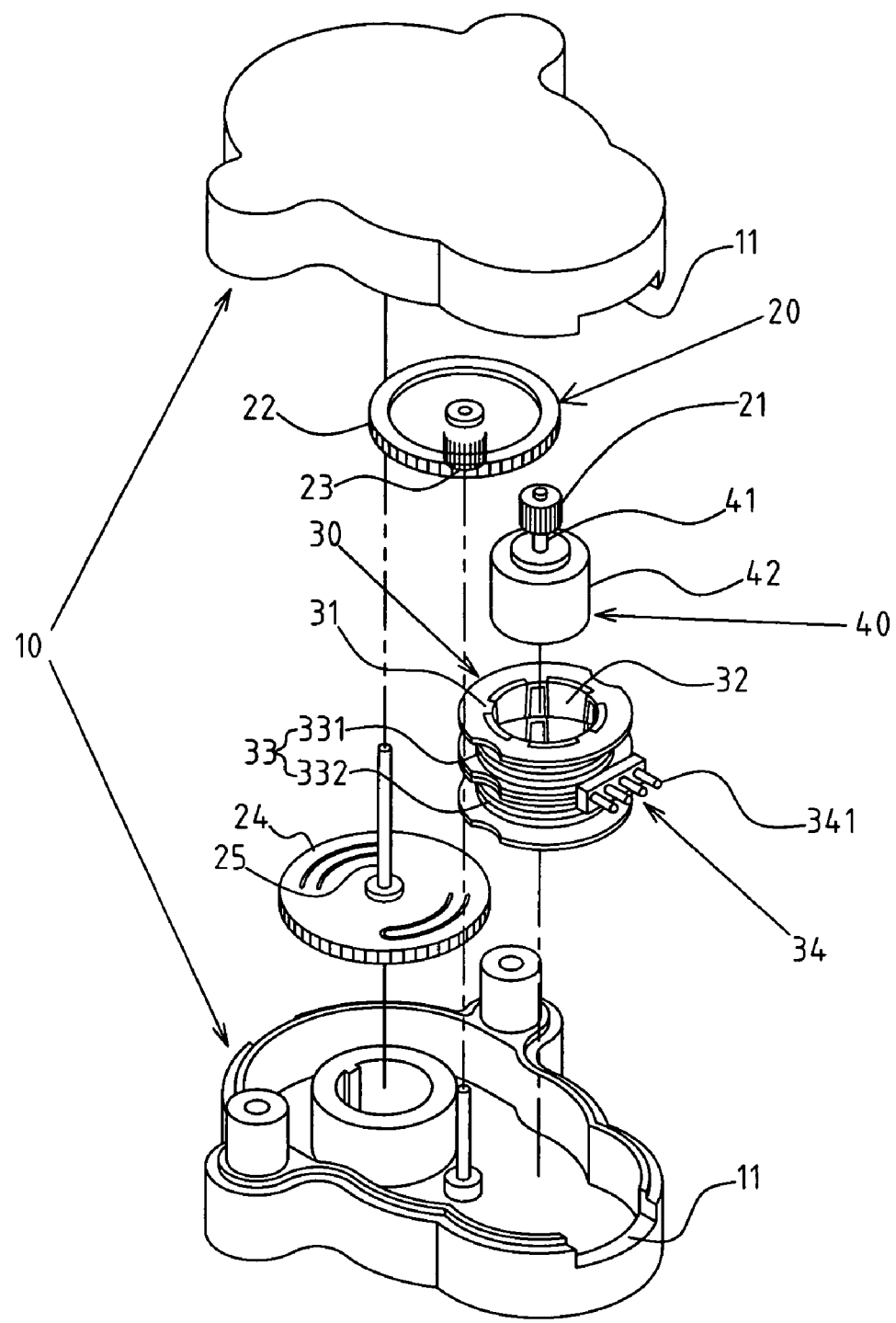
FIG. 3 shows an exploded perspective view of the preferred embodiment of the present invention.

As shown in FIG. 3, the driving unit A is placed on a predetermined location inside the housing of the analog meter. By so doing, a deceleration unit 20 is driven by a driving unit A.

The driving unit A comprises a stator unit 30, which has a longitudinal hollow column shape. The stator unit 30 includes a longitudinal hollow column 31, a claw 32, a coil set 33 and an input terminal 34. The gears of the claw 32 are lined up around the center hole of the column, and it can be separated by insulative tape. By so doing, it can effectively improve the disadvantage of the conventional coil set of the driving unit for the analog meter radiating around the side of the rotator. The coil set 33 includes a tape A for coil set 331 and tape B for coil set 332, so that the input terminal 34 is placed between the tape A for the coil set 331 and tape B for the coil set 332.

The input terminal 34 can be comprised of at least four pins 341, and extend out through a lateral through hole 11 of the housing.

A rotor unit 40 is placed inside the column 31 of the stator unit 30, and the rotor unit 40 includes a mandrel 41 and a magnetic rim 42. The magnetic rim 22 can be permanent magnets, and the rotation of the rotor unit 40 is achieved by placing the magnetic rim 42 inside the column 31 of the stator unit 30. The effect between the magnetic fields is created by the stator magnetic phase switch from the stator unit 30 and the permanent magnetic feature of the magnetic rim 22.

The deceleration unit 20 engages a small gear wheel 21 that is placed on the mandrel 41 of the rotor unit 40. The deceleration unit 20 also includes a big gear wheel 22 that moves with it. Another small gear wheel 23 is placed at the bottom of the big gear wheel 22, and the small gear wheel 23 is connected to the big gear wheel 24, and the decelerated force comes from a mandrel 25 connected to the center of the big gear wheel 24.

A driving unit for analog meter is made by the components mentioned above, and it is through the related device that the size of the total driving unit A is reduced to one fourth, so that the extended input terminal 34 can be more condensed and easier to connect.

Figure 4:
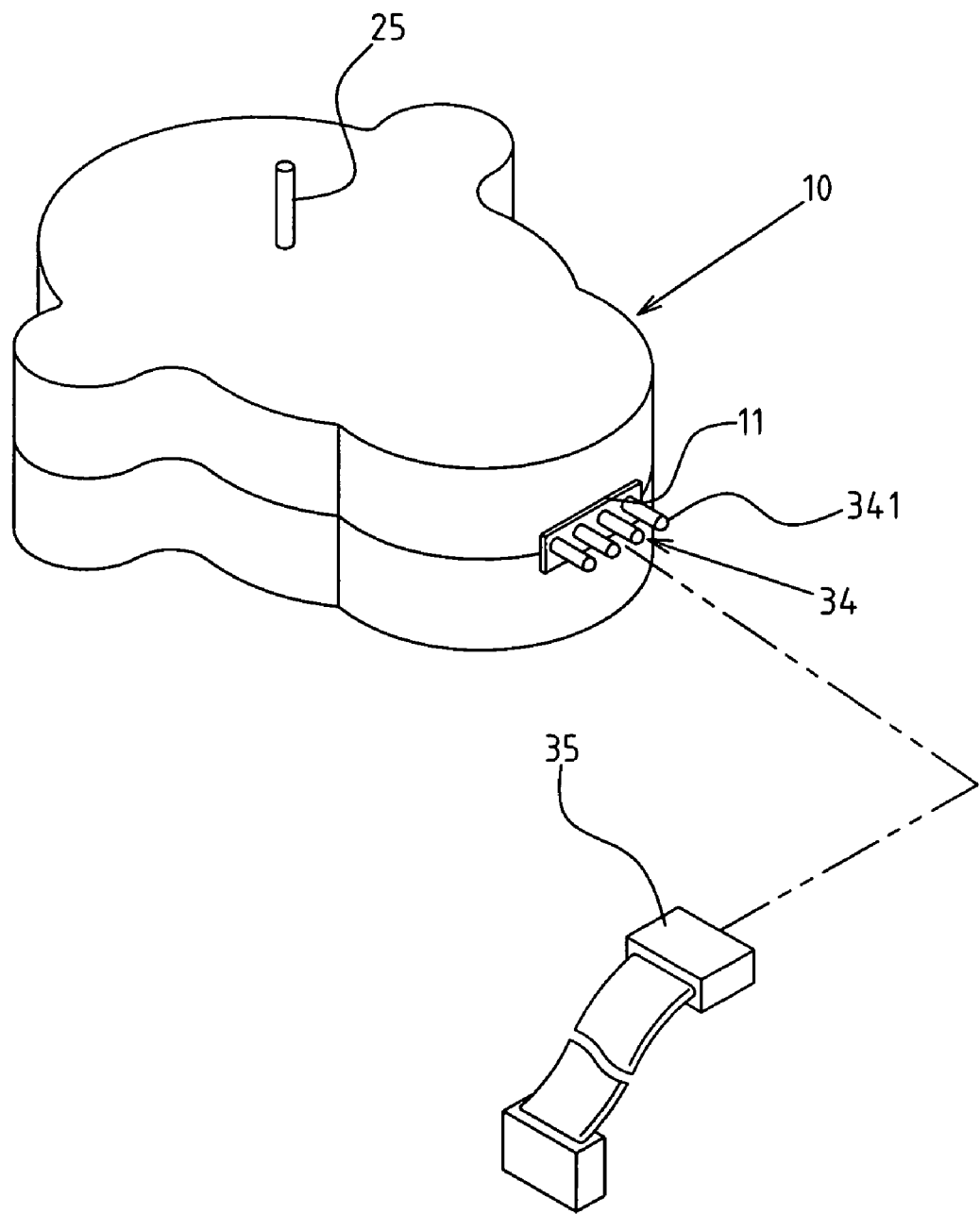
FIG. 4 shows a perspective view of another preferred embodiment of the present invention.

The driving unit A is integrated with the pin 341 of the input terminal 34, so that the connection may be completed within a certain scope. Previously, the space between the coil set is too large and makes the pin separated too far, causing inconvenient assembly. When using the connecting line 35 to connect the present invention (as shown in FIG. 4), the entire driving unit has more flexibility.

Figure 5:
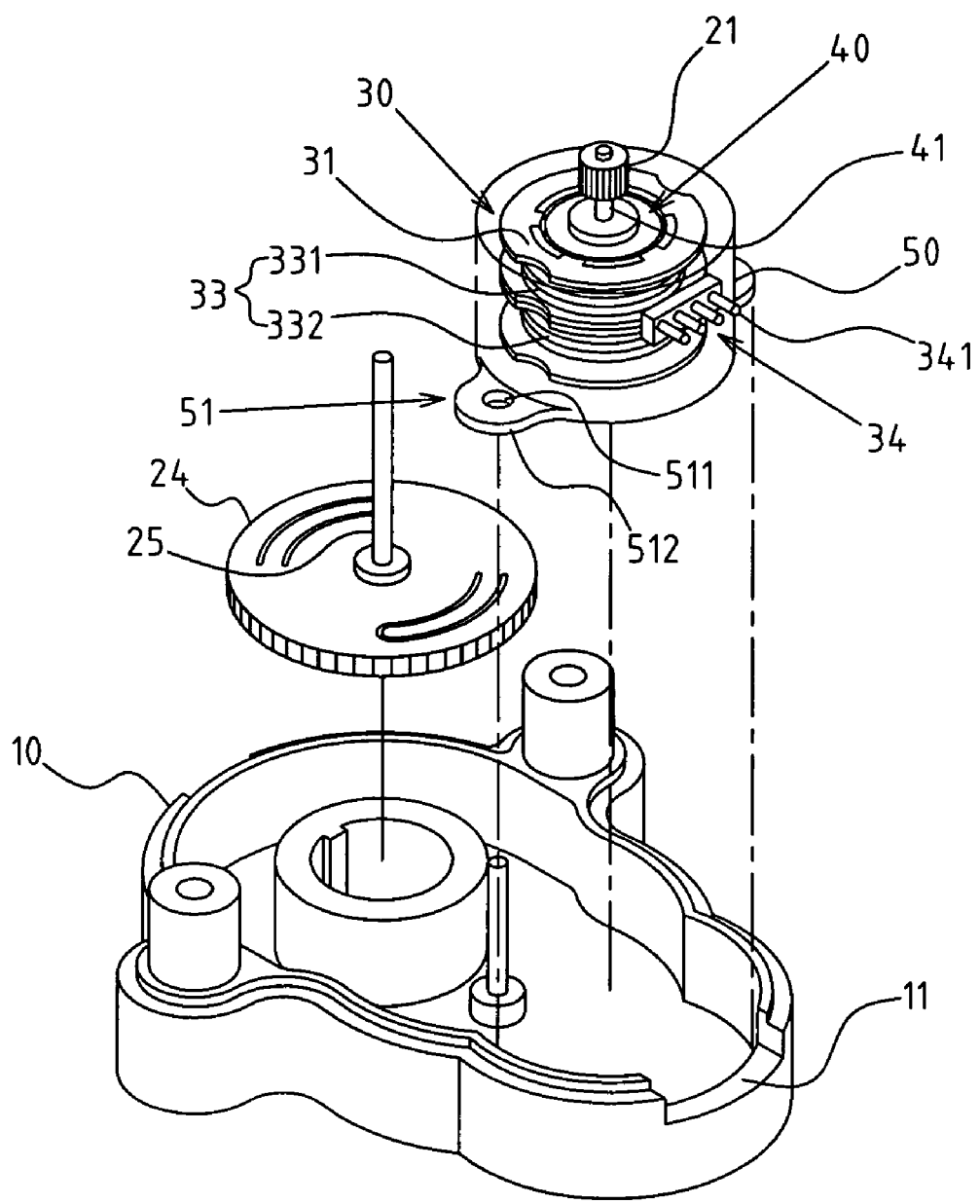
FIG. 5 shows an exploded perspective view of another preferred embodiment of the present invention.

As shown in FIG. 5, there is another preferred embodiment of the present invention. The external part of the stator unit 30 and the rotor unit 40 can be made into one piece through a casing. A connecting part 51 can be placed on a predetermined part of the casing 50 at the bottom of the present embodiment. The connecting part 51 of the present invention has protruding ear 512 that has locking hole 511, so that it can be locked into the bottom wall of the housing 10 by bolts.

To sum up, the driving unit for analog meter of the present invention uses the integrated design to make the tape A for coil set 331 and tape B for coil set 332 into a column shape. The driving unit saves room around the edge and guides the pin 34 of the input terminal 34 directly from the side of the housing 10 to save more space. The connection is made easier to connect, and the driving unit leaves more room inside the meter. By so doing, the assembly of the driving unit is not limited, making the modification more practical. The present invention has better practicability among the same type of products.

We claim:

1. A driving unit for analog meter, wherein the driving unit is placed on the predetermined location inside the housing of the analog meter to drive a deceleration unit, and the driving unit comprising:

a stator unit, which is longitudinal hollow column shaped, including a longitudinal hollow column, a claw, a coil set and an input terminal; and a rotor unit, which is placed inside the column of the stator unit, including a mandrel and magnetic rim;

wherein the deceleration unit comprises a first small gear wheel placed on the mandrel of the rotor unit, a first big gear wheel moving with the first small gear wheel, a second small gear wheel at the bottom of the first big gear wheel, and a second big gear wheel connected to the second small gear wheel, a decelerated force coming from a mandrel connected to the center of the second big gear wheel.

2. The driving unit defined in claim 1, wherein the input terminal of the stator unit is connected by pins.

3. The driving unit defined in claim 1, wherein the coil set of the stator unit includes a tape A for coil set and tape B for coil set, so that the input terminal is placed between the tape A for the coil set and tape B for the coil set.

4. The driving unit defined in claim 1, wherein the input terminal extends out through a lateral through hole of the housing.

5. The driving unit defined in claim 1, wherein the external part of the stator unit and rotor unit is assembled into one piece by a casing.

6. The driving unit defined in claim 5, wherein the connecting positioning part is placed on the predetermined part of the casing.

* * * * *